US011043469B1

(12) United States Patent
Shih

(10) Patent No.: US 11,043,469 B1
(45) Date of Patent: Jun. 22, 2021

(54) METHOD OF FORMING THREE DIMENSIONAL SEMICONDUCTOR STRUCTURE

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 10 days.

(21) Appl. No.: 16/795,538

(22) Filed: Feb. 19, 2020

(51) Int. Cl.
| | |
|---|---|
| *H01L 21/304* | (2006.01) |
| *H01L 23/00* | (2006.01) |
| *H01L 21/306* | (2006.01) |
| *H01L 21/311* | (2006.01) |
| *H01L 21/768* | (2006.01) |
| *H01L 25/00* | (2006.01) |

(Continued)

(52) U.S. Cl.
CPC ............ *H01L 24/89* (2013.01); *H01L 21/304* (2013.01); *H01L 21/30604* (2013.01); *H01L 21/31116* (2013.01); *H01L 21/76816* (2013.01); *H01L 21/76877* (2013.01); *H01L 21/76898* (2013.01); *H01L 24/05* (2013.01); *H01L 24/08* (2013.01); *H01L 25/0657* (2013.01); *H01L 25/50* (2013.01); *H01L 21/3212* (2013.01); *H01L 21/7684* (2013.01); *H01L 2224/0557* (2013.01); *H01L 2224/08147* (2013.01); *H01L 2224/80895* (2013.01); *H01L 2224/80896* (2013.01); *H01L 2225/06541* (2013.01); *H01L 2225/06565* (2013.01)

(58) Field of Classification Search
CPC ............... H01L 24/89; H01L 21/76877; H01L 21/31116; H01L 21/30604; H01L 25/50; H01L 21/304; H01L 21/76816; H01L 24/08; H01L 21/76898; H01L 24/05; H01L 25/0657; H01L 2225/06565; H01L 2224/80896; H01L 21/3212; H01L 2224/80895; H01L 2225/06541; H01L 2224/0557; H01L 2224/08147; H01L 21/7684
See application file for complete search history.

(56) References Cited

U.S. PATENT DOCUMENTS 8,860,229 B1 * 10/2014 Lin .................... H01L 21/76897
257/774
2010/0193964 A1 * 8/2010 Farooq .................... H01L 25/50
257/774

(Continued)

*Primary Examiner* — Thanh T Nguyen
(74) *Attorney, Agent, or Firm* — CKC & Partners Co., LLC

(57) ABSTRACT

A method of forming a three dimensional semiconductor structure includes: forming a through dielectric via extending on a first surface of a first interlayer dielectric layer of a first device; bonding the first device and a second device by the first surface and a second surface of the second device such that a through silicon contact pad on the second surface covers the through dielectric via; performing an etching process on a back side of a first substrate of the first device opposite to the first interlayer dielectric layer to simultaneously form a first via hole and a second via hole and exposing the second via hole through the through silicon contact pad; and forming a first via plug to fill the first via hole, and a second via plug to fill the second via hole and the through dielectric via.

12 Claims, 10 Drawing Sheets

(51) Int. Cl.
  *H01L 25/065*     (2006.01)
  *H01L 21/321*     (2006.01)

(56) References Cited

U.S. PATENT DOCUMENTS

| | | | |
|---|---|---|---|
| 2016/0049384 A1* | 2/2016 | Lu | H01L 23/562 257/737 |
| 2017/0033144 A1* | 2/2017 | Takahashi | H01L 27/14634 |
| 2017/0207158 A1* | 7/2017 | Kang | H01L 23/49811 |
| 2020/0243591 A1* | 7/2020 | Iijima | H01L 25/07 |

* cited by examiner

METHOD OF FORMING THREE DIMENSIONAL SEMICONDUCTOR STRUCTURE

BACKGROUND

Field of Invention

The present disclosure relates to a method of forming a three dimensional semiconductor structure.

Description of Related Art

The statements in this section merely provide background information related to the present disclosure and do not necessarily constitute prior art.

With the increasing density of electronic components, three dimensional circuit routing schemes have begun to be developed. In recent years, through silicon via (TSV) technology that connects an upper electronic device and a lower electronic device has flourished. A process of forming the TSV may start from a surface of the upper electronic device. A completion of the TSV structure is able to electrically connect to circuit interconnections of the upper electronic device and circuit interconnections of the lower electronic device, and is able to receive external signals. However, in general cases, multi-step etching processes are necessary to complete the TSV structure as described above. Recently there is also an alternative method that embeds an etch delay structure in a specific part of the upper electronic device so that TSVs of different depths can be generated in the same etching process. After that a three dimensional circuit structure that can be in direct electrical connection with the upper electronic device and the lower electronic device from one surface of the upper electronic device is formed.

SUMMARY

According to some embodiments of the present disclosure, a method of forming a three dimensional semiconductor structure is provided. The method includes: preparing a first device with a first circuit and a first interlayer dielectric layer on a first substrate, in which the first interlayer dielectric layer surrounds the first circuit and contacts the first substrate; forming a through dielectric via extending from a first surface of the first interlayer dielectric layer into the first interlayer dielectric layer, in which the first surface is opposite to the first substrate; bonding the first device and a second device by the first surface of the first interlayer dielectric layer and a second surface of the second device such that a through silicon contact pad exposed out from the second surface of the second device covers the through dielectric via; performing an etching process on a back side of the first substrate opposite to the first interlayer dielectric layer to simultaneously form a first via hole and a second via hole and exposing the second via hole through the through silicon contact pad; and forming a first via plug to fill the first via hole, and a second via plug to fill the second via hole and the through dielectric via, in which the first via plug is in contact with one of first interconnections of the first circuit, and the second via plug is in contact with said through silicon contact pad.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
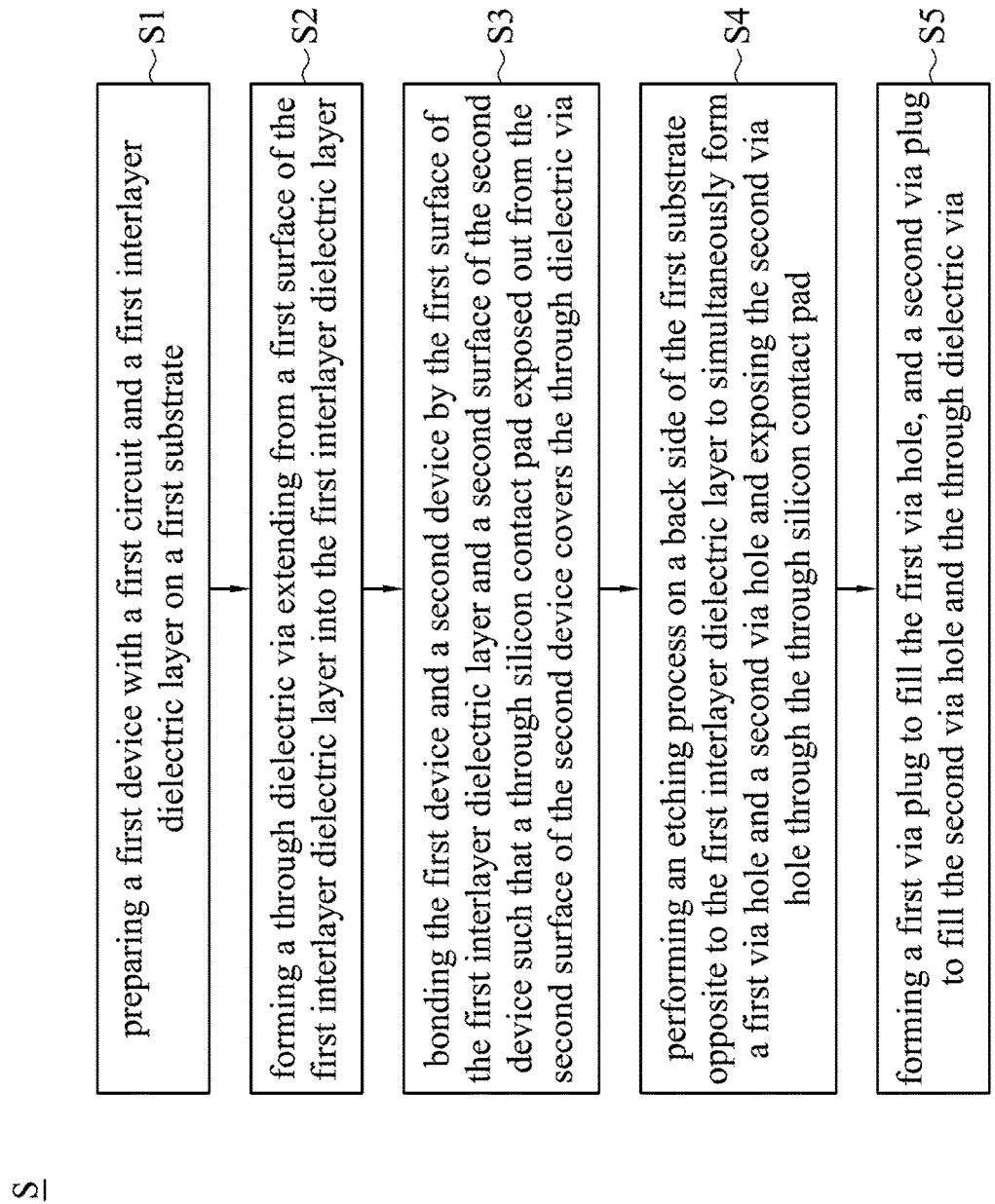
FIG. 1 is a flow chart of a method of forming a three dimensional semiconductor structure according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, the description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment" or the like means that a particular feature, structure, configuration, or characteristic described in connection with the embodiment is included in at least one embodiment of the disclosure. Thus, the appearances of the phrase "in one embodiment," "in an embodiment" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Reference is made to FIGS. 1 to 9. FIG. 1 is a flow chart of a method S of forming a three dimensional semiconductor structure according to some embodiments of the present disclosure. FIGS. 2A to 9 are schematic cross-sectional views of intermediate stages of the method S illustrated by FIG. 1 according to some embodiments of the present disclosure. The method S begins with operation S1 in which a first device 110 is prepared with a first circuit 114 and a first interlayer dielectric layer 116 on a first substrate 112, in which the first interlayer dielectric layer 116 surrounds the first circuit 114 and contacts the first substrate 112 (as referred to FIG. 2A). In some embodiments, the first circuit 114 is embedded in the first interlayer dielectric layer 116. Specifically, first interconnections 1142 of the first circuit 114 are enclosed by and in contact with the first interlayer dielectric layer 116. First conductive pads 1144 of the first circuit 114 are electrically connected with the first interconnections 1142 and in contact with the first interlayer dielectric layer 116. Furthermore, the first conductive pads 1144 are exposed from a first surface 1102 of the first interlayer dielectric layer 116, in which the first surface 1102 is opposite to the first substrate 112. In some embodiments, the first device 110 is prepared by forming the first circuit 114 and the first interlayer dielectric layer 116 on the first substrate 112 (e.g., by deposition).

Figure 2A:
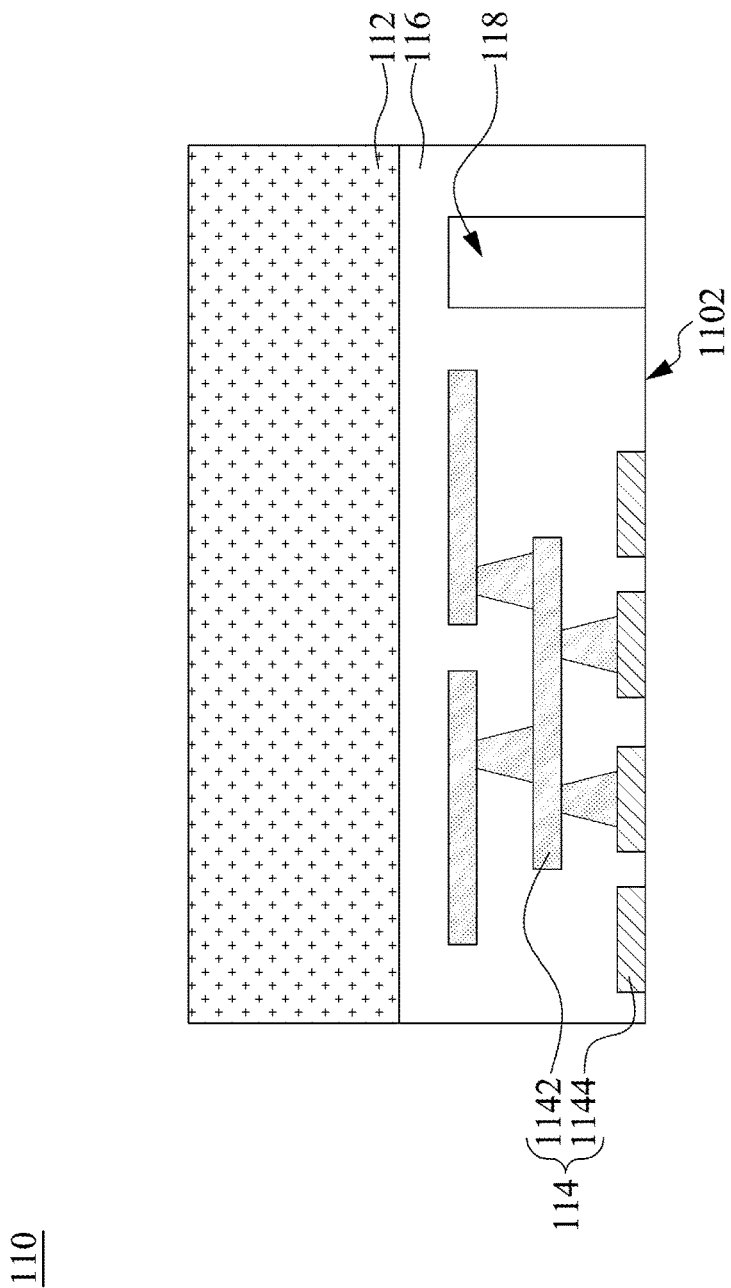
FIG. 2A is a schematic cross-sectional view of an intermediate stage of forming the three dimensional semiconductor structure according to some embodiments of the present disclosure.
Figure 2B:
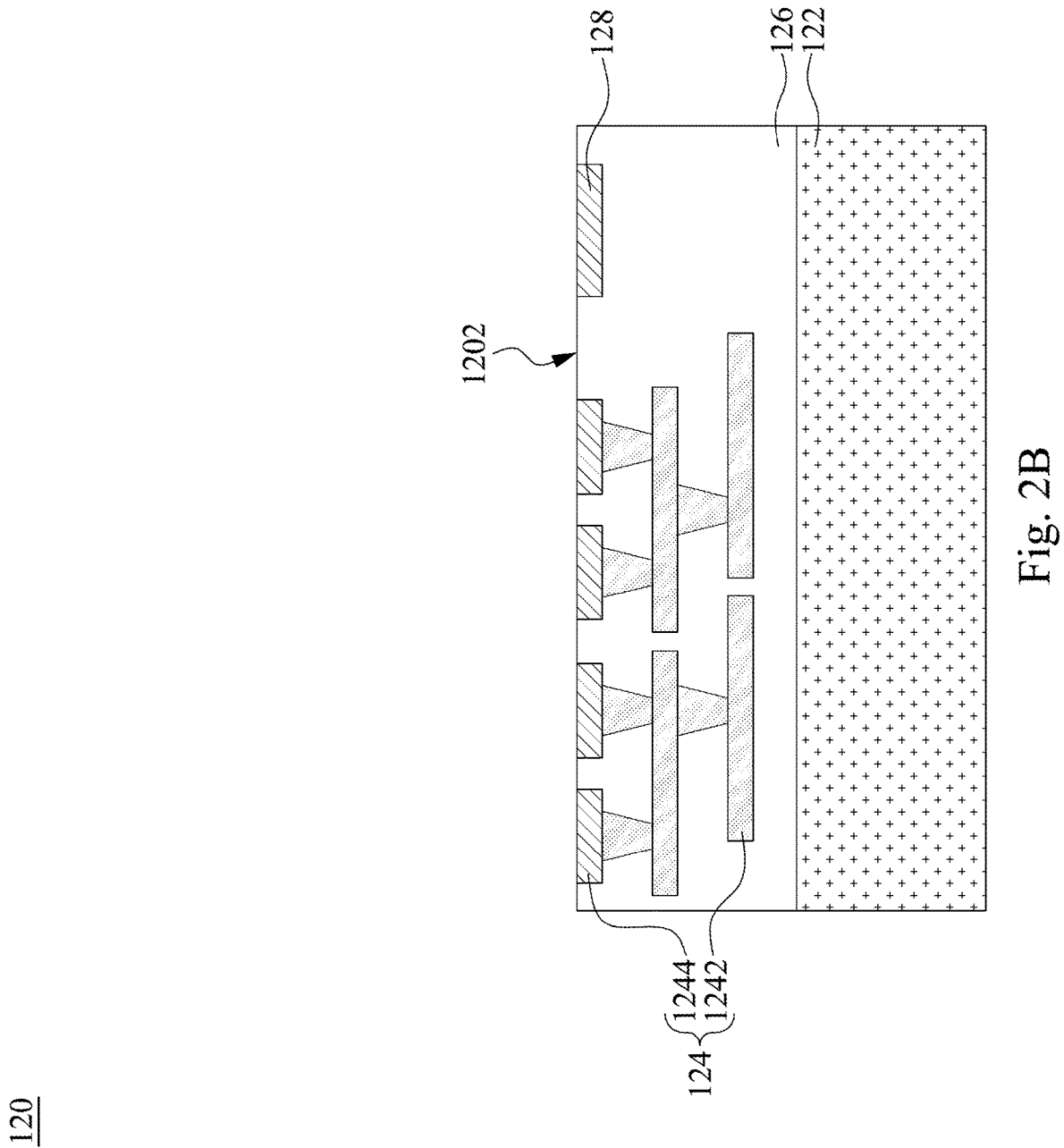
FIG. 2B is a schematic cross-sectional view of an intermediate stage of forming the three dimensional semiconductor structure according to some embodiments of the present disclosure.
Figure 3:
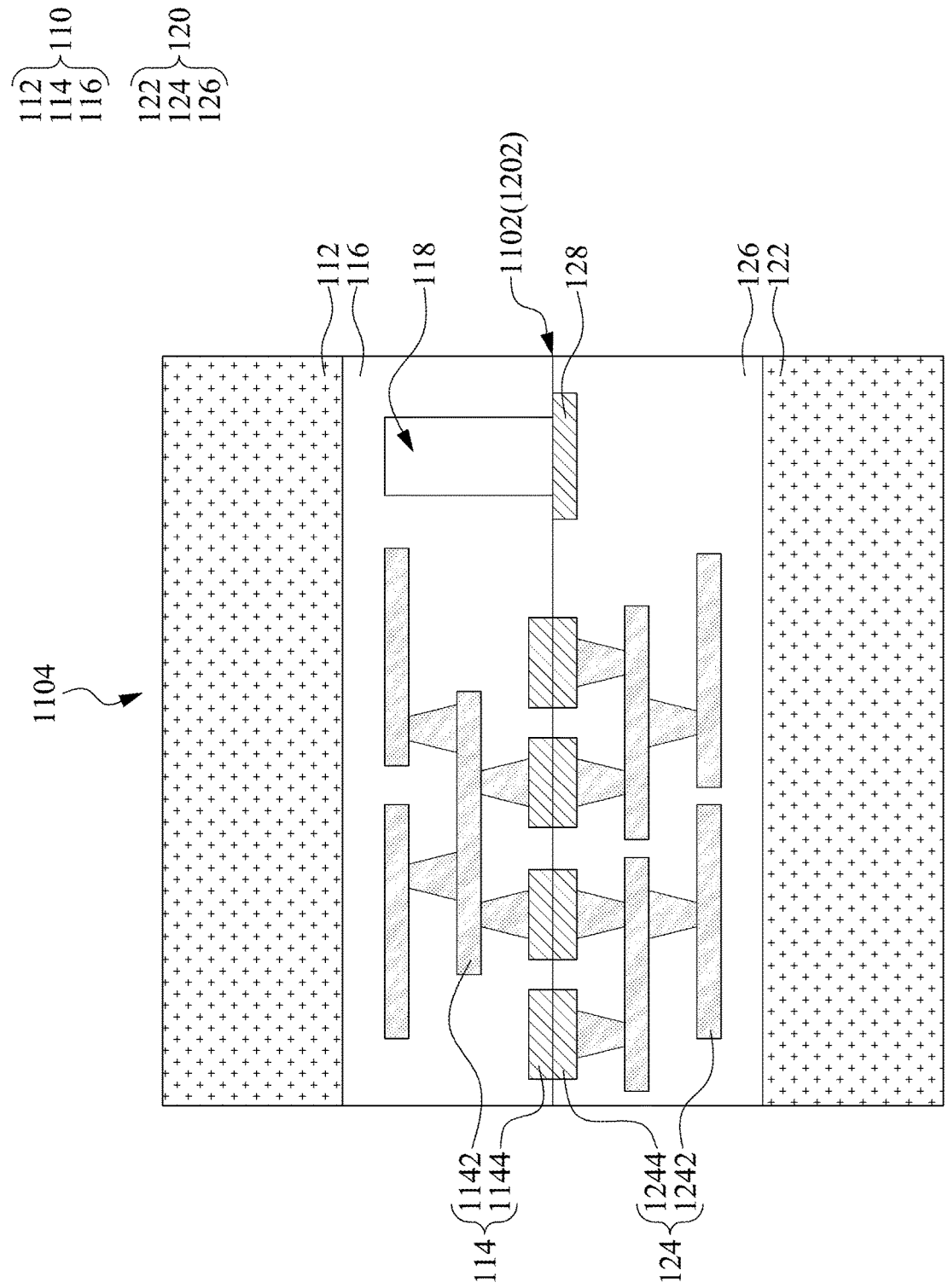
FIG. 3 is a schematic cross-sectional view of an intermediate stage of forming the three dimensional semiconductor structure according to some embodiments of the present disclosure.
Figure 4:
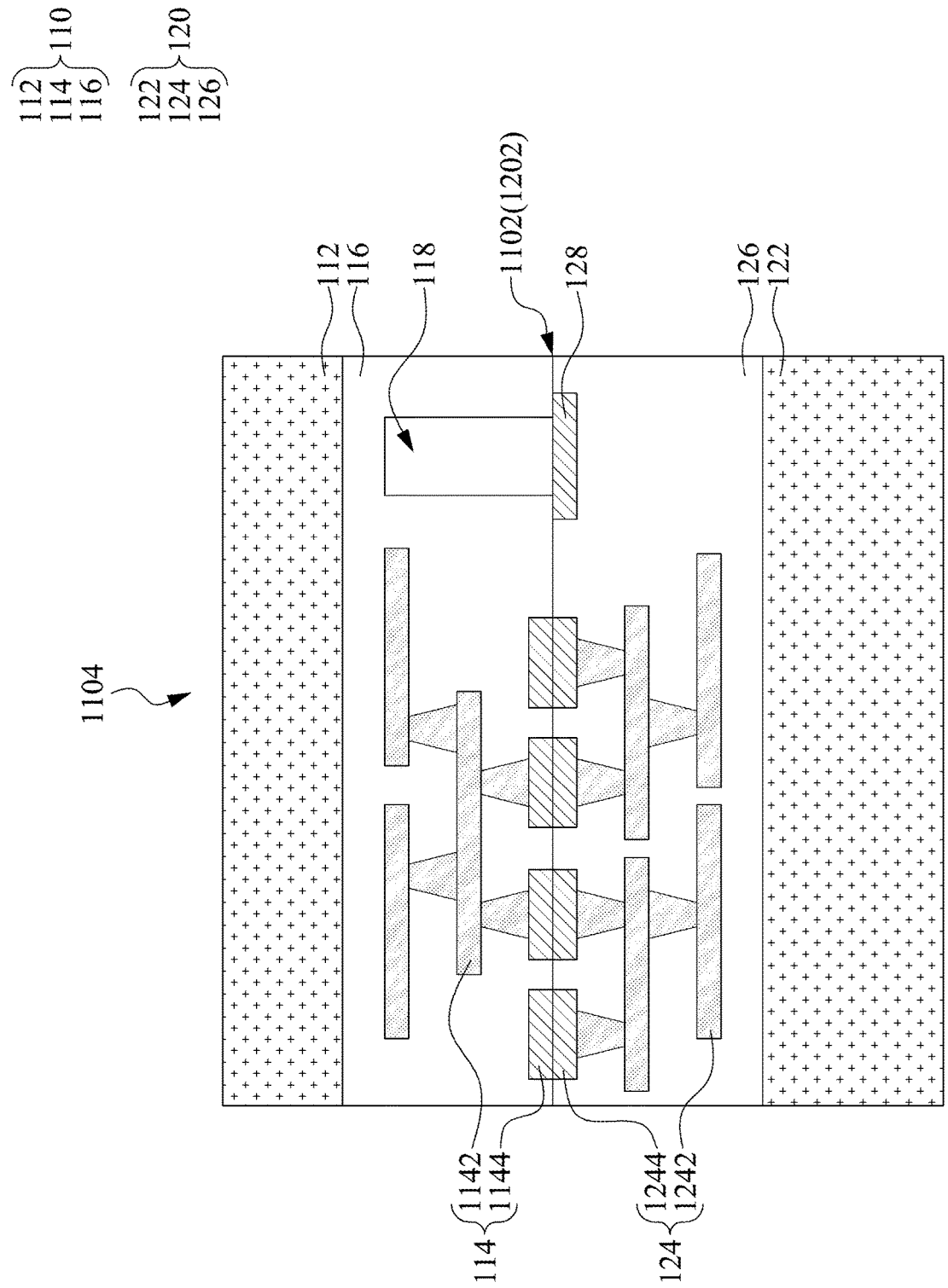
FIG. 4 is a schematic cross-sectional view of an intermediate stage of forming the three dimensional semiconductor structure according to some embodiments of the present disclosure.
Figure 5:
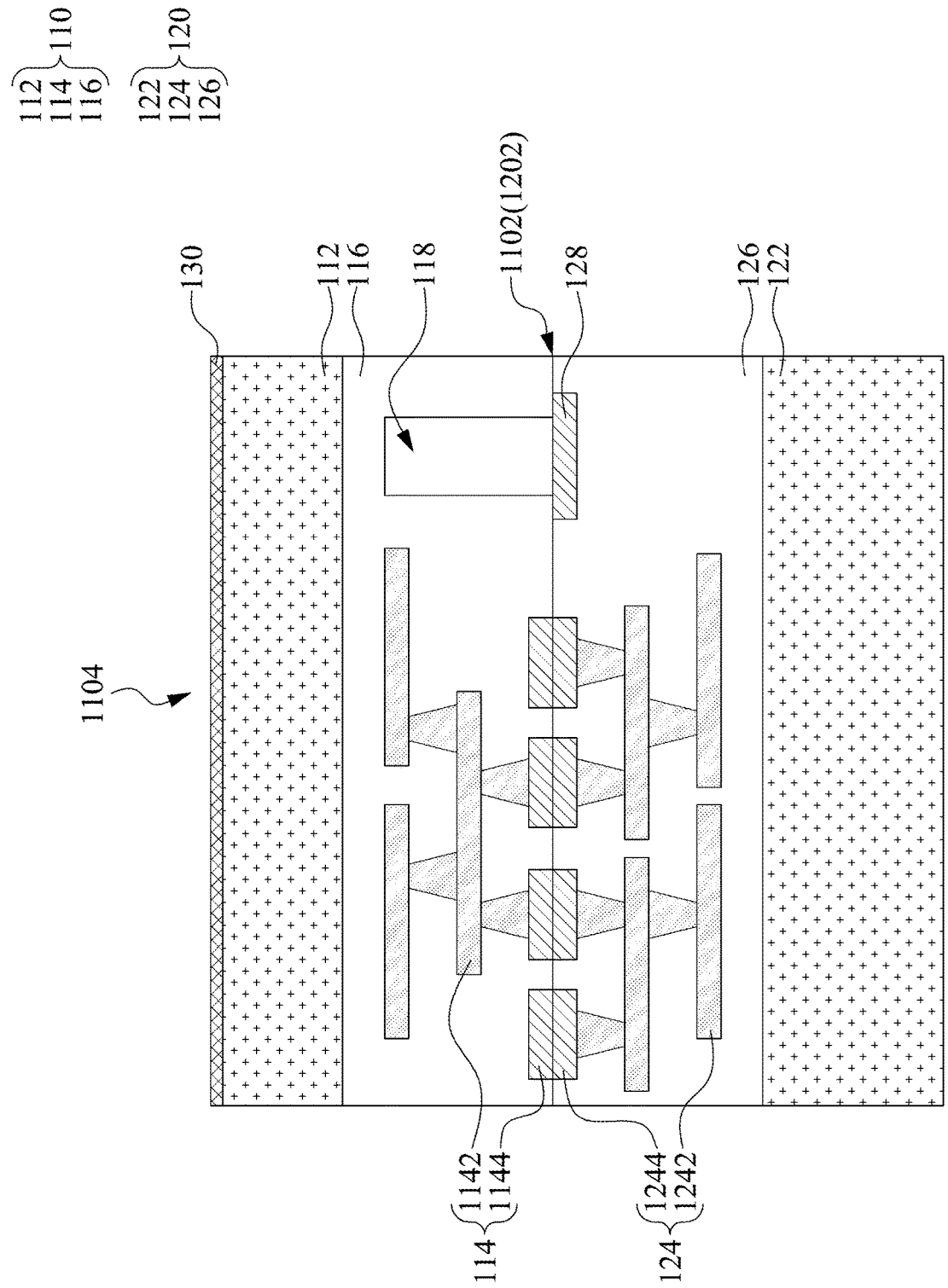
FIG. 5 is a schematic cross-sectional view of an intermediate stage of forming the three dimensional semiconductor structure according to some embodiments of the present disclosure.
Figure 6:
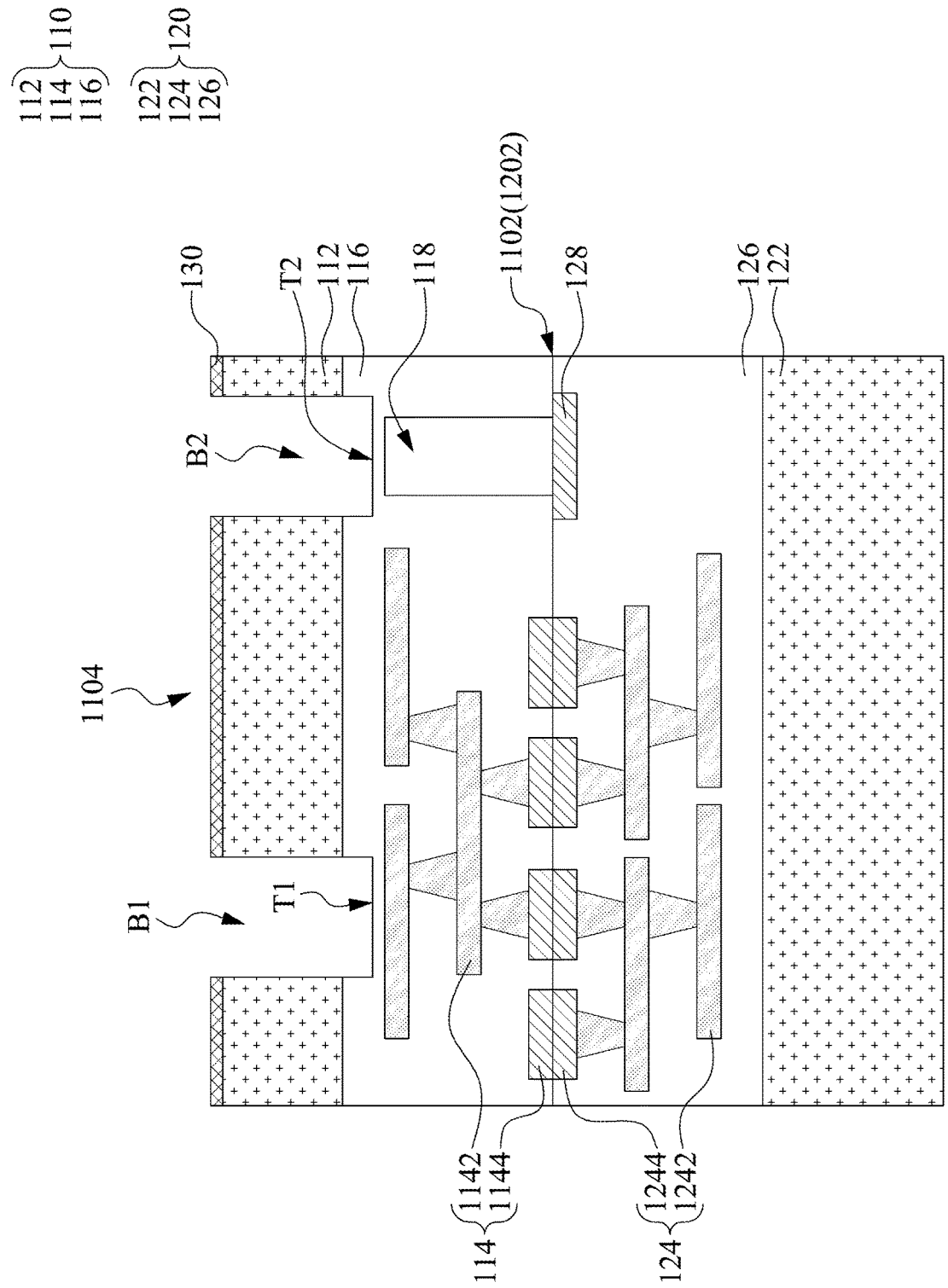
FIG. 6 is a schematic cross-sectional view of an intermediate stage of forming the three dimensional semiconductor structure according to some embodiments of the present disclosure.

The method S continues with operation S2 in which a through dielectric via 118 extending from the first surface 1102 of the first interlayer dielectric layer 116 into the first interlayer dielectric layer 116 is formed, (as also referred to FIG. 2A). The through dielectric via 118 can be formed by e.g., wet etching or dry etching, but should not be limited thereto. The method S continues with operation S3 in which the first device 110 and a second device 120 are bonded by the first surface 1102 of the first interlayer dielectric layer 116 and a second surface 1202 of the second device 120 such that a through silicon contact pad 128 exposed out from the second surface 1202 of the second device 120 covers the through dielectric via 118 (as referred to FIGS. 2B and 3). In some embodiments, the first device 110 and the second device 120 are hybrid bonded such that some of the first conductive pads 1144 of the first circuit 114 are bonded to and in contact with some of second conductive pads 1244 of a second circuit 124, and the first interlayer dielectric layer 116 is bonded to and in contact with a second interlayer dielectric layer 126 of the second device 120. In some embodiments, the first conductive pads 1144 are exposed out from the first surface 1102 and in contact with a portion of the first interconnections 1142, and the second conductive pads 1244 are exposed out from the second surface 1202 and in contact with a portion of second interconnections 1242. The first interconnections 1142 and the second interconnections 1242 may be circuits distributed to form multiple circuit layers embedded in the first interlayer dielectric layer 116 and the second interlayer dielectric layer 126 respectively. The first interconnections 1142 and the second interconnections 1242 may also include conductive parts connecting different circuit layers.

The first interconnections 1142, the second interconnections 1242, the first conductive pads 1144, and the second conductive pads 1244 may include metals such as tungsten (W), aluminum (Al), and copper (Cu), metal silicides such as tungsten silicide ($WSi_2$) and titanium silicide ($TiSi_2$), metal compounds such as tungsten nitride ($W_3N_2$) and titanium nitride (TiN), a doped polycrystalline silicon (poly-Si), or combinations thereof, but should not be limited thereto.

The first interlayer dielectric layer 116 and the second interlayer dielectric layer 126 may include insulating materials, such as silicon dioxide ($SiO_2$), but should not be limited thereto.

In some embodiments, the second device 120 is prepared by forming the second circuit 124 and the second interlayer dielectric layer 126 on a second substrate 122 (e.g., by deposition). The second interlayer dielectric layer 126 surrounds the second circuit 124, the through silicon contact pad 128 is exposed out from the second surface 1202 of the second interlayer dielectric layer 126, and the second surface 1202 is opposite to the second substrate 122.

The first substrate 112 and the second substrate 122 may include a bulk single-crystalline silicon wafer, a silicon-on-insulator (SOI) wafer, a compound semiconductor wafer such as a silicon-germanium (SiGe), or a wafer on which a silicon epitaxial layer is grown, but should not be limited thereto.

The method S continues with operation S4 in which an etching process is performed on a back side 1104 of the first substrate 112 opposite to the first interlayer dielectric layer 116 to simultaneously form a first via hole V1 and a second via hole V2, and the through silicon contact pad 128 is exposed through the second via hole V2 (as referred to FIGS. 3 to 8). In some embodiments, a position for the first via hole V1 is pre-aligned with one of the first interconnections 1142 as mentioned, and a position for the second via hole V2 is pre-aligned with the through silicon contact pad 128 before the first via hole V1 and the second via hole V2 are formed. In some embodiments, after operation S3, the first substrate 112 is partially removed from the back side 1104 of the first substrate 112 before performing the etching process (as referred to FIG. 4). In some embodiments, the partial removal is performed by silicon (Si) grinding, but should not be limited thereto. With the Si grinding, it is easier for the subsequent etching process to etch through the first substrate 112. In some embodiments, a passivation layer 130 is formed on the back side 1104 of the first substrate 112 before performing the etching process (as referred to FIG. 5). After that, a dry etching process on the back side 1104 may be performed to remove a portion of the passivation layer 130, and then a wet etching process may be performed to form a first blind hole B1 and a second blind hole B2 (as referred to FIG. 6). It is noted that the operations of eliminating the portion of the passivation layer 130 and forming the first blind hole B1 and the second blind hole B2 are not limited to the processes as mentioned above. In some other embodiments, eliminating the portion of the passivation layer 130 and forming the first blind hole B1 and the second blind hole B2 may be performed in one dry etching process. In the embodiments as mentioned, a first temporary end T1 of the first blind hole B1 is in close proximity (e.g., extended in the interlayer dielectric layer 116) to one of the first interconnections 1142, and a second temporary end T2 of the second blind hole B2 is in close proximity (e.g., extended in the interlayer dielectric layer 116) to the through dielectric via 118. The passivation layer 130 may include silicon dioxide ($SiO_2$), silicon nitride (SiNx), or organic materials such as benzocyclobutene (BCB), but should not be limited thereto.

Figure 7:
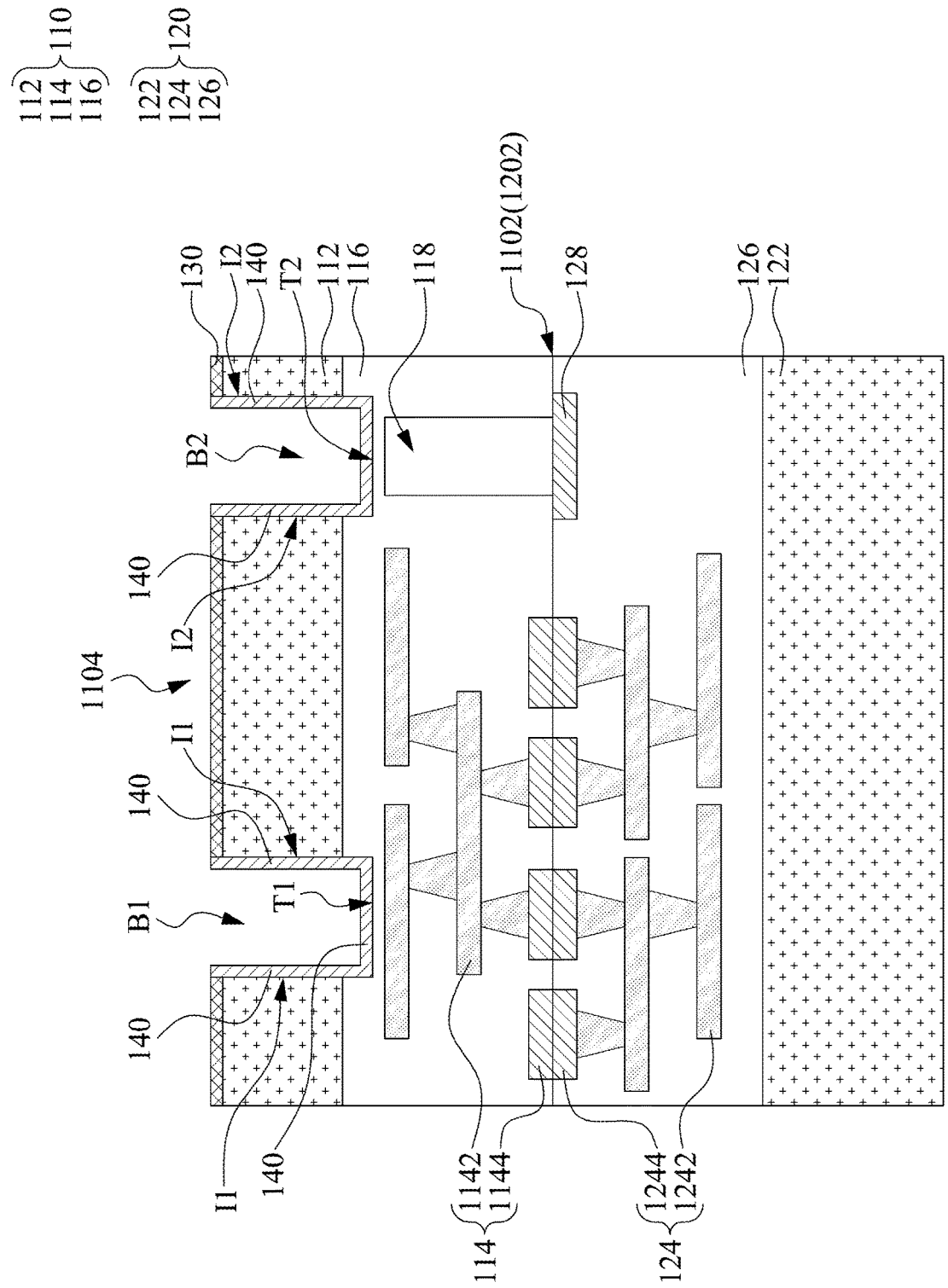
FIG. 7 is a schematic cross-sectional view of an intermediate stage of forming the three dimensional semiconductor structure according to some embodiments of the present disclosure.
Figure 8:
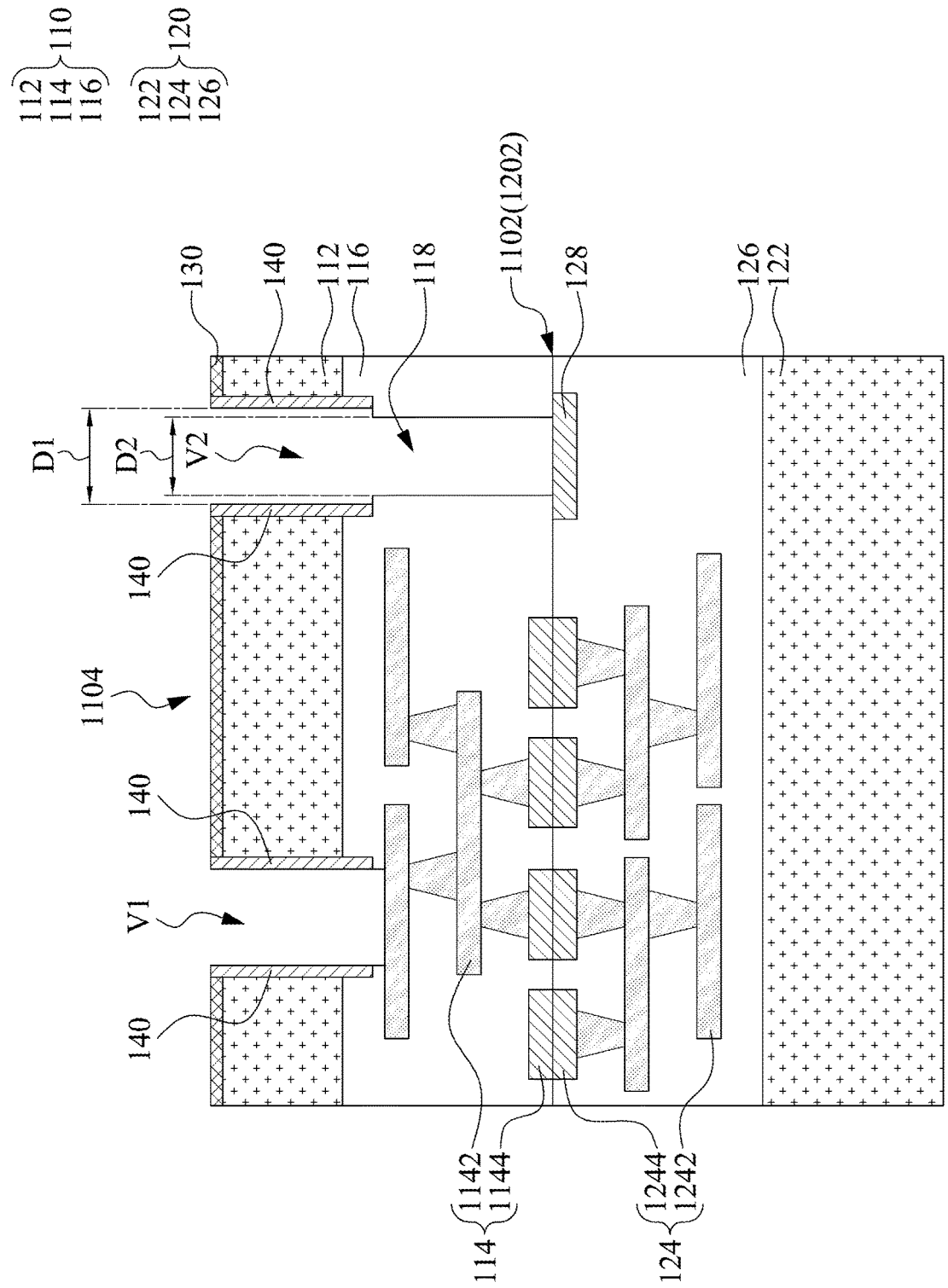
FIG. 8 is a schematic cross-sectional view of an intermediate stage of forming the three dimensional semiconductor structure according to some embodiments of the present disclosure.
Figure 9:
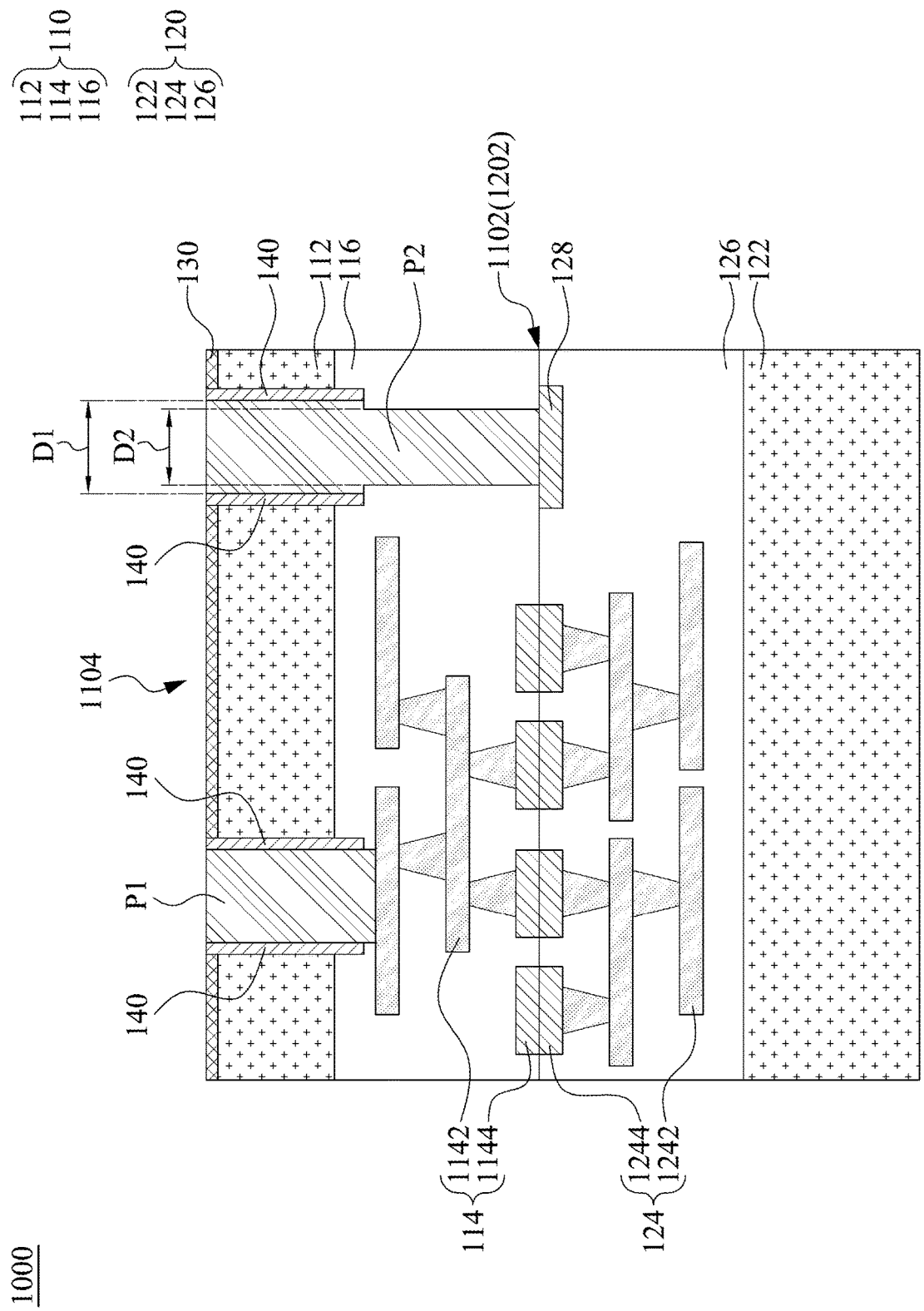
FIG. 9 is a schematic cross-sectional view of an intermediate stage of forming the three dimensional semiconductor structure according to some embodiments of the present disclosure.

In some embodiments, an isolation layer 140 is conformally formed in the first blind hole B1 and the second blind hole B2 (as referred to FIG. 7). The isolation layer 140 may include insulating materials, such as materials the same as those used for the passivation layer 130, but should not be limited thereto. The isolation layer 140 may be formed on a first inner wall 11 of the first substrate 112 in the first blind hole B1, the first temporary end T1, a second inner wall 12 of the first substrate 112 in the second blind hole B2, and the second temporary end T2, but should not be limited thereto. After the formation of the isolation layer 140, the back side 1104 of the first substrate 112 is then etched to form the first via hole V1 from the first blind hole B1 and to form the second via hole V2 from the second blind hole B2 (as referred to FIG. 8). In some embodiments, the isolation layer 140 and the first interlayer dielectric layer 116 is etched until one of the first interconnections 1142 as mentioned is exposed from the first via hole V1, and the through silicon contact pad 128 is exposed from the second via hole V2.

The method S continues with operation S5 in which a first via plug P1 is formed to fill the first via hole V1, and a second via plug P2 is formed to fill the second via hole V2 and the through dielectric via 118. The first via plug P1 and the second via plug P2 may include metals such as tungsten, aluminum, cobalt, nickel and copper, and/or metal silicides, but should not be limited thereto. The first via plug P1 is in contact with said one of the first interconnections 1142 of the first circuit 114, and the second via plug P2 is in contact with the through silicon contact pad 128. The isolation layer 140 remaining on the first inner wall 11 in the first blind hole B1 on the second inner wall 12 in the second blind hole B2 prevents contacts and direct electrical connections between the first via plug P1 and the first substrate 112 and between the second via plug P2 and the first substrate 112. From the above processes, a three dimensional semiconductor structure 1000 is formed (as referred to FIG. 9). Direct electrical connections from the back side 1104 of the first device 110 to the first interconnections 1142 (through the first via plug P1) and from the back side 1104 of the first device 110 to the through silicon contact pad 128 (through the second via plug P2) can be simultaneously formed without using any extra etch delay structure to control an etching rate of the first via hole V1. In some embodiments, a diameter D1 of the second via hole V2 is greater than a diameter D2 of the through dielectric via 118, so as to prevent from possible current leakage between the second via plug P2 and the first substrate 112. In some embodiments, a chemical mechanical planarization (CMP) process is performed on the first via plug V1, the second via plug V2, and the passivation layer 130. That is, the CMP process is performed on the back side 1104 after the formation of the first via plug V1 and the second via plug V2 to flatten the back side 1104.

In summary, embodiments of the present disclosure provide a method of forming a three dimensional semiconductor structure, in which electrical connections from one surface of the three dimensional semiconductor structure to the first device and to the second device can be simultaneously formed by substantially one etching and one deposition processes. An extra etch delay structure for decreasing etching rates of forming some via holes when the etching process is performed is omitted.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the method and the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of forming a three dimensional semiconductor structure, comprising:
    preparing a first device with a first circuit and a first interlayer dielectric layer on a first substrate, wherein the first interlayer dielectric layer surrounds the first circuit and contacts the first substrate;
    forming a through dielectric via extending from a first surface of the first interlayer dielectric layer into the first interlayer dielectric layer, wherein the first surface is opposite to the first substrate;
    bonding the first device and a second device by the first surface of the first interlayer dielectric layer and a second surface of the second device such that a through silicon contact pad exposed out from the second surface of the second device covers the through dielectric via; and
    performing an etching process on a back side of the first substrate opposite to the first interlayer dielectric layer to simultaneously form a first via hole and a second via hole and exposing the through silicon contact pad through the second via hole.

2. The method of claim 1, wherein the second device is further prepared by:
    forming a second circuit and a second interlayer dielectric layer on a second substrate, wherein the second interlayer dielectric layer surrounds the second circuit, the through silicon contact pad is on the second surface of the second interlayer dielectric layer, and the second surface is opposite to the second substrate.

3. The method of claim 2, wherein said bonding comprises:
    hybrid bonding the first device and the second device such that a first conductive pad of the first circuit is bonded to a second conductive pad of the second circuit, and the first interlayer dielectric layer is bonded to the second interlayer dielectric layer, wherein the first conductive pad is exposed out from the first surface and is in contact with a portion of first interconnections of the first circuit, and the second conductive pad is exposed out from the second surface and is in contact with a portion of second interconnections of the second circuit.

4. The method of claim 1, further comprising partially removing the first substrate from the back side of the first substrate before performing the etching process.

5. The method of claim 4, wherein the partially removing is performed by silicon grinding.

6. The method of claim 1, further comprising forming a passivation layer on the back side of the first substrate before performing the etching process.

7. The method of claim 1, wherein performing the etching process comprises:

etching the back side of the first substrate to form a first blind hole and a second blind hole, such that a first temporary end of the first blind hole is in close proximity to one of first interconnections of the first circuit, and a second temporary end of the second blind hole is in close proximity to the through dielectric via;

forming an isolation layer conformally in the first blind hole and the second blind hole; and etching the back side of the first substrate to form the first via hole from the first blind hole and the second via hole from the second blind hole.

8. The method of claim 7, wherein etching the isolation layer is performed by dry etching.

9. The method of claim 7, wherein etching the back side of the first substrate to form the first via hole from the first blind hole and the second via hole from the second blind hole comprises:

etching the isolation layer and the first interlayer dielectric layer until one of first interconnections of the first circuit is exposed from the first via hole, and the through silicon contact pad is exposed from the second via hole.

10. The method of claim 1, wherein a diameter of the second via hole is greater than a diameter of the through dielectric via.

11. The method of claim 1, wherein the first via hole and the second via hole are formed such that one of first interconnections of the first circuit is exposed from the first via hole, and the through silicon contact pad is exposed from the second via hole.

12. The method of claim 1, further comprising:

forming a first via plug to fill the first via hole, and a second via plug to fill the second via hole and the through dielectric via, wherein the first via plug is in contact with one of first interconnections of the first circuit, and the second via plug is in contact with said through silicon contact pad.

\* \* \* \* \*